US008816797B2

(12) United States Patent
Nosaka

(10) Patent No.: US 8,816,797 B2
(45) Date of Patent: *Aug. 26, 2014

(54) MULTILAYER RESONATOR AND MULTILAYER FILTER

(75) Inventor: Koji Nosaka, Ishikawa-gun (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/568,160

(22) Filed: Aug. 7, 2012

(65) Prior Publication Data

US 2012/0299666 A1      Nov. 29, 2012

Related U.S. Application Data

(63) Continuation of application No. 12/825,511, filed on Jun. 29, 2010, now Pat. No. 8,264,302, which is a continuation of application No. PCT/JP2009/050217, filed on Jan. 9, 2009.

(30) Foreign Application Priority Data

Jan. 17, 2008   (JP) .................................. 2008-007579

(51) Int. Cl.
*H03H 7/09*   (2006.01)
*H03H 5/02*   (2006.01)
*H03H 7/01*   (2006.01)
*H03H 1/00*   (2006.01)

(52) U.S. Cl.
CPC . *H03H 5/02* (2013.01); *H03H 7/09* (2013.01); *H03H 7/1783* (2013.01); *H03H 2001/0085* (2013.01)
USPC .......................................... 333/185; 333/175

(58) Field of Classification Search
CPC ..... H03H 7/0115; H03H 7/09; H03H 7/1766; H03H 7/1783; H03H 2001/0085; H03H 5/02
USPC .................................. 333/168, 175, 176, 185
See application file for complete search history.

(56) References Cited

U.S. PATENT DOCUMENTS 6,369,684 B1 * 4/2002 Iida et al. ...................... 336/200
6,768,399 B2 * 7/2004 Uriu et al. ..................... 333/204

(Continued)

FOREIGN PATENT DOCUMENTS

JP           03-274814 A     12/1991

OTHER PUBLICATIONS

Nosaka; "Multilayer Resonator and Multilayer Filter"; U.S. Appl. No. 12/825,511, filed Jun. 29, 2010.

(Continued)

*Primary Examiner* — Benny Lee
*Assistant Examiner* — Gerald Stevens
(74) *Attorney, Agent, or Firm* — Keating & Bennett, LLP

(57) ABSTRACT

A multilayer filter includes a plurality of mutually coupled resonant circuits provided within a multilayer body. Capacitor internal electrodes, inductor internal electrodes, and inductor via electrodes, ground via electrodes, and input-output via electrodes are arranged within the multilayer body. The ground via electrodes and the input-output via electrodes are provided on a dielectric layer on a mounting surface, or a second dielectric layer on a first dielectric layer provided on the mounting surface. The capacitor internal electrodes arranged towards the side of the mounting surface do not overlap the input-output electrodes when viewed in plan view. With this configuration, degradation in frequency characteristics of a resonant circuit is effectively prevented by controlling one of an inductive component and a capacitive component of the resonant circuit.

21 Claims, 12 Drawing Sheets

(56) References Cited

U.S. PATENT DOCUMENTS

| | | | |
|---|---|---|---|
| 8,264,302 B2* | 9/2012 | Nosaka | 333/175 |
| 2006/0192637 A1* | 8/2006 | Urano et al. | 333/204 |
| 2007/0241839 A1* | 10/2007 | Taniguchi | 333/185 |

OTHER PUBLICATIONS

Official Communication issued in corresponding European Patent Application No. 09701837.8, mailed on Oct. 1, 2013.
Official Communication issued in corresponding European Patent Application No. 09 701 837.8, mailed on Apr. 6, 2014.

* cited by examiner

US 8,816,797 B2

MULTILAYER RESONATOR AND MULTILAYER FILTER

BACKGROUND OF THE INVENTION

1. Field of the Invention

The present invention relates to a multilayer resonator and a multilayer filter, each including a resonant circuit in a multilayer body defined by a laminate including a plurality of dielectric layers.

2. Description of the Related Art

A multilayer filter having a plurality of LC resonant circuits in a multilayer body defined by a laminate including a plurality of dielectric layers is used as a high-frequency filter. The LC resonant circuit may include a capacitor defined by opposed internal electrodes and an inductor defined by a via (for example, see Japanese Unexamined Patent Application Publication (Translation of PCT Application) No. 2000-165171).

FIGS. 1A and 1B illustrate a known multilayer filter. FIG. 1A is a perspective view of the filter and FIG. 1B is a sectional view of the filter.

A laminate including five layers of insulating sheets 162A-162E is arranged as the multilayer filter 161. Vias 163A-163C are arranged in the insulating sheet 162A. Vias 164A-164C are arranged in the insulating sheet 162B. Vias 165A-165C, and coupling capacitors 166A and 166B are arranged in the insulating sheet 162C. Capacitor electrodes 167A-167C are arranged in the insulating sheet 162D. A capacitor electrode 168 is arranged on the insulating sheet 162E. A ground electrode 169C extending from the front surface (not shown) of the multilayer filter 161 to the rear surface (not shown) of the multilayer filter 161 via the top surface is also provided. An input-output terminal 169A is arranged on the left end surface of the multilayer filter 161 and an input-output terminal 169B is arranged on the right end surface of the multilayer filter 161.

In the multilayer filter 161, capacitor electrodes 167A and 167C are connected to the input-output terminals 169A and 169B and define resonant circuits at input-output stages. With this arrangement, routing lines for connecting the capacitor electrodes 167A and 167C to the input-output terminals 169A and 169B are required. The routing lines function as open stubs, and provide a parasitic inductive component to the LC resonator. For this reason, the multilayer filter 161 has an unwanted spurious component in frequency characteristics thereof, and has degraded attenuation characteristics.

When the ground electrode 169C is formed on the outer surface of the multilayer filter 161 by plating or other suitable method, loss in the vias 163A-163C increases due to corrosion of the vias 163A-163C. There is a risk that the frequency characteristics of the multilayer filter 161 will be degraded. During use, the vias 163A-163C are influenced by an external magnetic field of the multilayer filter 161. There is also a risk that the frequency characteristics of the multilayer filter 161 will be degraded.

SUMMARY OF THE INVENTION

To overcome the problems described above, preferred embodiments of the present invention provide a multilayer resonator and a multilayer filter, each controlling frequency characteristics thereof with an inductive component and a capacitive component that are stabilized in the resonant circuit thereof.

A multilayer resonator according to a preferred embodiment of the present invention includes first and second capacitor internal electrodes, an inductor internal electrode, a first inductor via electrode, a second inductor via electrode, a first mounting surface connection via electrode, and a second mounting surface connection via electrode. The first capacitor internal electrode is mounted towards the side of the mounting surface with respect to the second capacitor internal electrode, and is arranged so that the first capacitor internal electrode does not overlap a second mounting surface electrode when viewed in a plan view taken from one of the main surfaces of the multilayer body.

A multilayer filter according to another preferred embodiment of the present invention includes a plurality of mutually coupled resonant circuits within a multilayer body. The resonant circuit of each of input-output stages includes first and second capacitor internal electrodes, an inductor internal electrode, a first inductor via electrode, a second inductor via electrode, a first mounting surface connection via electrode, and a second mounting surface connection via electrode. The first capacitor internal electrode is mounted towards the side of the mounting surface with respect to the second capacitor internal electrode, and is arranged so that the first capacitor internal electrode does not overlap the second mounting surface electrode when viewed in a plan view taken from one of the main surfaces of the multilayer body.

The first and second capacitor internal electrodes are disposed on different dielectric layers in the multilayer body. The multilayer body is produced by laminating a plurality of dielectric layers. The inductor internal electrode is provided on a dielectric layer different from the dielectric layers of first and second capacitor internal electrodes. The first inductor via electrode is electrically connected to the inductor internal electrode and the first capacitor internal electrode. The second inductor via electrode is electrically connected to the inductor internal electrode and the second capacitor internal electrode. The first mounting surface connection via electrode is electrically connected to the first capacitor internal electrode and a first mounting surface electrode. The first mounting surface electrode is provided on the mounting surface of the multilayer body, and defines one of a ground electrode and an input-output electrode. The second mounting surface connection via electrode is electrically connected to the second capacitor internal electrode and a second mounting surface electrode. The second mounting surface electrode is provided on the mounting surface of the multilayer body and defines one of the ground electrode and the input-output electrode.

The first and second capacitor internal electrodes define a capacitor. The inductor internal electrode, the first inductor via electrode and the second inductor via electrode define an inductor. The capacitor and the inductor are connected in parallel with each other between the ground terminal and the input-output terminals, and define an LC parallel resonant circuit.

With the above-described arrangement, the mounting surface connection via electrode preferably has a length equal or substantially equal to the thickness of several dielectric layers. Since the length of the via electrode is stable and consistent, an inductive component of the LC parallel resonant circuit is also stable and consistent.

The capacitor internal electrode arranged towards the side of the mounting surface is arranged so that the capacitor internal electrode does not overlap the mounting surface connected to the other capacitor internal electrode when viewed in plan view. Thus, almost no capacitance is generated between the capacitor internal electrode and the mounting surface electrode. The capacitance between these electrodes is unwanted from a design point of view of a resonator and a filter. Since such a capacitance is not generated, a capacitive component of the LC parallel resonant circuit is stable.

Since the inductor is disposed within the dielectric layers and is not exposed outside from an outer surface, degradation is not caused during manufacture. Thus, the inductive component of the resonant circuit is stable. Furthermore, the effect of an external magnetic field is effectively controlled during use.

The first inductor via electrode and the first mounting surface connection via electrode may be co-axially arranged. The second inductor via electrode and the second mounting surface connection via electrode may be co-axially arranged.

The second capacitor internal electrode may be arranged so that the second capacitor internal electrode overlaps the first mounting surface electrode when viewed in a plan view taken from one of the main surfaces of the multilayer body. Since the first capacitor internal electrode is arranged between the second capacitor internal electrode and the first mounting surface electrode, no unwanted capacitance is generated if these electrodes overlap each other.

The first capacitor internal electrode may be disposed on a dielectric layer on the mounting surface. With this arrangement, the length of the via electrode connecting the first capacitor internal electrode to the mounting surface electrode can be effectively controlled, and a parasitic inductive component can be decreased.

A resonant circuit at an intermediate stage that is coupled with at least one of the resonant circuits at the input-output stages may be included. In such a case, the resonator at the intermediate stage may include the first and second capacitor internal electrodes, the inductor internal electrode, the first inductor via electrode, the second inductor via electrode, and a mounting surface connection via electrode connected between one of the first and second capacitor internal electrodes and the ground electrode. The resonant circuit at the intermediate stage is preferably disposed only within the multilayer body. Variations in frequency characteristics due to a deviation of the mounting position are advantageously controlled.

The mounting surface connection via electrode may be directly electrically connected to the ground electrode. In this case, no ground electrode is provided within the multilayer body, and the via electrode is directly connected to the ground electrode arranged external to the multilayer body. A parasitic inductance generated in an interlayer ground electrode is thus effectively controlled and design accuracy of the inductor is improved.

The ground electrode of the resonant circuit at the intermediate stage may be arranged between the input-output electrodes on the mounting surface. With this arrangement, isolation of the input-output electrodes is advantageously increased.

Each of the resonant circuits may be arranged perpendicular or substantially perpendicular to the lamination direction of the dielectric layers. In this case, loops, each defined by the inductor internal electrode, the first inductor via electrode, and the second inductor via electrode in each of the resonant circuits, overlap each other when viewed from the direction of the arrangement of the resonant circuits. With this arrangement, magnetic coupling between the resonant circuits is increased. The frequency characteristics are advantageously widened in frequency.

At least one of the inductor internal electrodes of the resonant circuits may have an electrode width different from the electrode widths of the remaining inductor internal electrodes. The inductive component of the inductor in each resonant circuit changes depending on the width of the electrode. The inductive component is finely adjusted by varying the electrode width.

At least one of the inductor internal electrodes of the resonant circuits may be provided on a dielectric layer different from the dielectric layers having the remaining inductor internal electrodes thereon. With this arrangement, the design flexibility of the inductor internal electrode is increased. Since the inductive component of the inductor in each resonant circuit varies depending on the electrode width of the inductor internal electrode, the inductive component can be finely adjusted by setting the electrode length to any desired value. Since the design flexibility of the inductor internal electrode is increased, the design flexibility of the LC parallel resonant circuit is also increased.

In accordance with various preferred embodiments of the present invention, the mounting surface connection via electrode connects the mounting surface electrode to the capacitor internal electrode, and the capacitor internal electrode arranged towards the side of the mounting surface is arranged so that the capacitor internal electrode does not overlap the mounting surface electrode connected to the other capacitor internal electrode when viewed in plan view. The capacitive component and the inductive component of the LC parallel resonant circuit are thus stabilized. The frequency characteristics of the resonator and filter are prevented from being degraded.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A multilayer resonator of a first preferred embodiment of the present invention is described below.

Figure 1A:
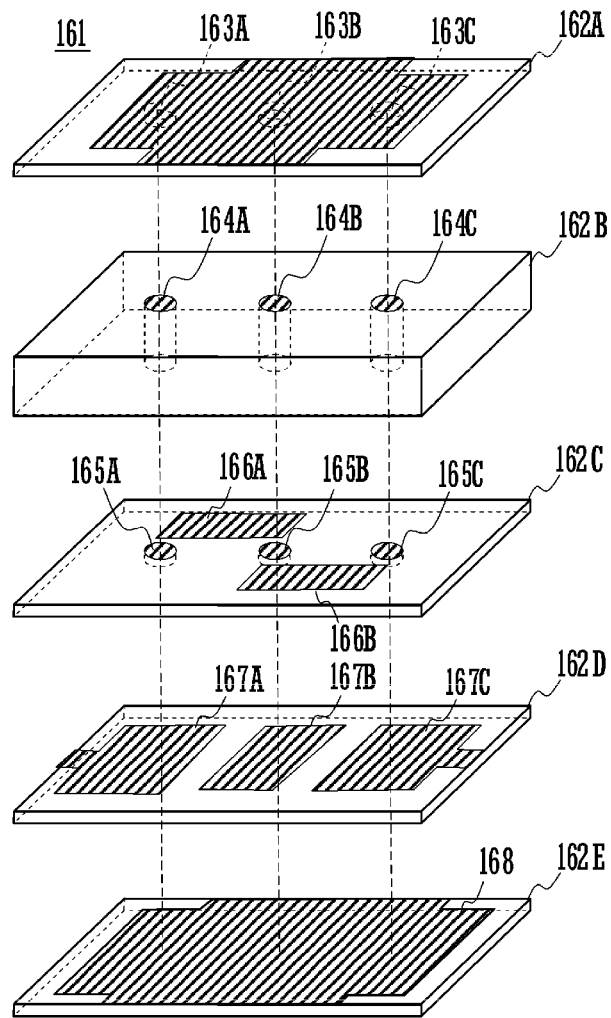
FIGS. 1A and 1B illustrate a structure of a known multilayer filter.
Figure 1B:
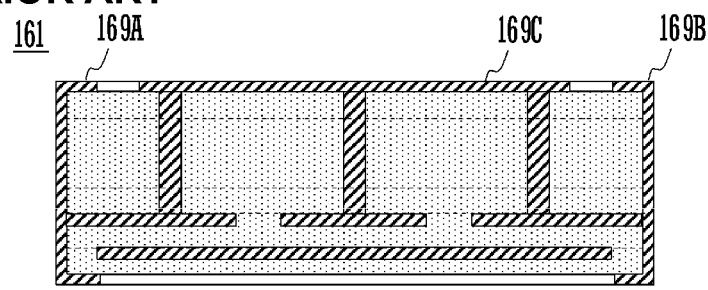
Figure 2:
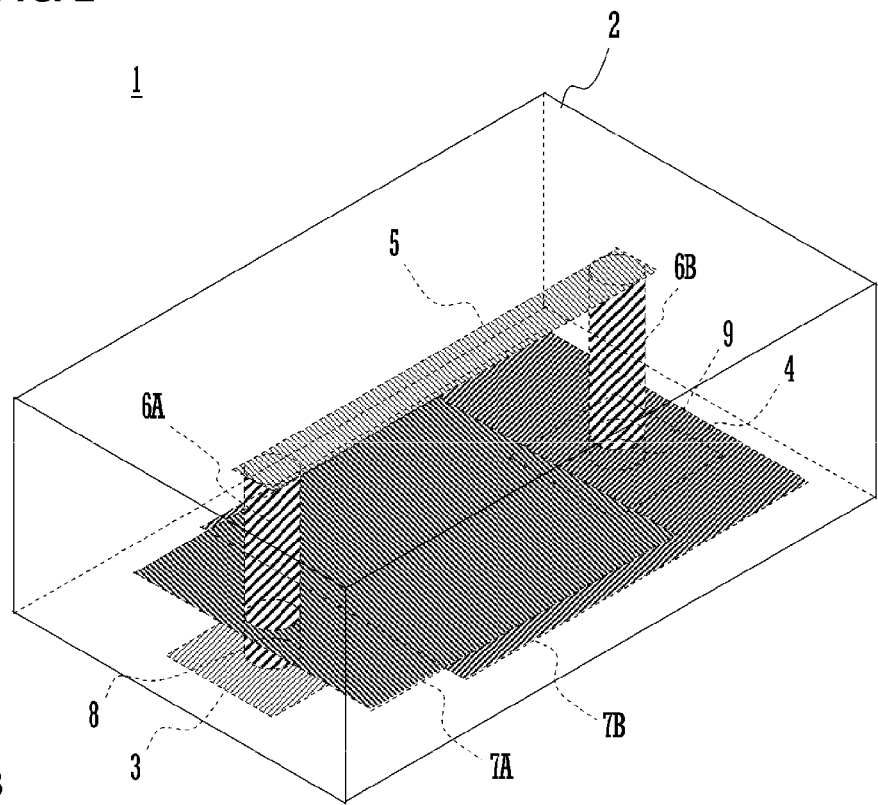
FIG. 2 is a see-through perspective view of a multilayer resonator of a first preferred embodiment of the present invention.
Figure 3:
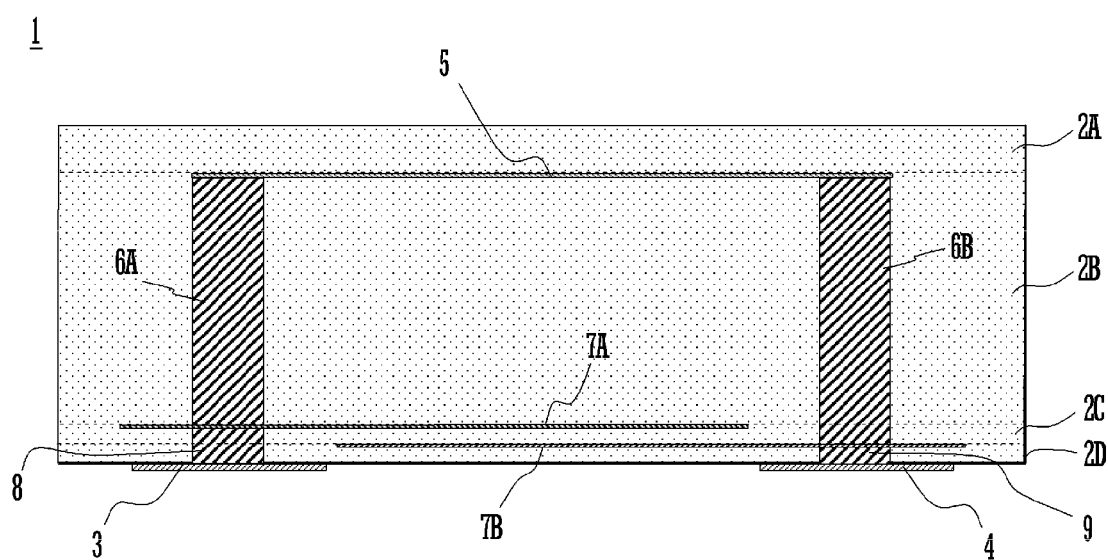
FIG. 3 is a sectional view of the resonator shown in FIG. 2.

FIG. 2 is a see-through perspective view of the resonator, and FIG. 3 is a sectional view of the resonator.

The multilayer resonator 1 is configured as an LGA (Land Grid Array) package, and includes an input-output electrode 3 and a ground electrode 4 disposed a mounting surface of a multilayer body 2. The surfaces of the multilayer body 2 other than the mounting surface thereof are covered with a metal layer (not shown). The ground electrode 4 corresponds to a first mounting surface electrode, and the input-output electrode 3 corresponds to a second mounting surface electrode.

The input-output electrode 3 and the ground electrode 4 are preferably produced by one of an application and firing process, a sputtering process, and a vapor deposition process, for example. For this reason, during the mounting of the multilayer resonator 1 to a mother board, a soldering operation on the side surface of the multilayer body 2 is eliminated and a soldering area is not required on the mother board. The multilayer resonator 1 thus enables high-density mounting.

The multilayer body 2 is produced by laminating a plurality of dielectric layers in a vertical direction of FIG. 3 as a lamination direction and firing the laminate. The plurality of dielectric layers 2A-2D are thus produced. The dielectric layers 2A-2D are preferably rectangular or substantially rectangular plates, and are preferably made of a low temperature co-fired ceramic (LTCC) having a specific dielectric constant Er of 53.5, for example. LTCC preferably includes glass and at least one material selected from the group consisting of titanium oxide, barium oxide, and aluminum oxide, for example.

The multilayer body 2 includes an inductor internal electrode 5, inductor via electrodes 6A and 6B, capacitor internal electrodes 7A and 7B, an input-output via electrode 8, and a ground via electrode 9 disposed therein. The capacitor internal electrode 7B corresponds to a first capacitor internal electrode, and the capacitor internal electrode 7A corresponds to a second capacitor internal electrode. The ground via electrode 9 corresponds to a first mounting surface connection via electrode, and the input-output via electrode 8 corresponds to a second mounting surface connection via electrode.

The internal electrodes 5, 7A, and 7B are preferably made of Ag, Pd, Cu, Au, or Ag—Pd, for example, and are produced using by printing, for example. The via electrodes 6A, 6B, 8, and 9 are preferably produced as via holes arranged in each dielectric layer or as a plurality of linking via holes. Each via hole is preferably produced by filling holes arranged beforehand on the dielectric sheet with an electrically conductive paste of Ag, Pd, Cu, Au, or Ag—Pd, for example.

The inductor internal electrode 5 is preferably a line electrode provided on the dielectric layer 2B. The inductor via electrode 6A is a via hole arranged in the dielectric layer 2B. The inductor via electrode 6A is arranged below the left end portion of the inductor internal electrode 5 as illustrated in FIG. 3 and connects the inductor internal electrode 5 to the capacitor internal electrode 7A. The inductor via electrode 6B is preferably an electrode connecting a via hole arranged in the dielectric layer 2B to a via hole arranged in the dielectric layer 2C. The inductor via electrode 6B is arranged below the right end portion of the inductor internal electrode 5 as illustrated in FIG. 3 and connects the inductor internal electrode 5 to the capacitor internal electrode 7B. The capacitor internal electrode 7A is preferably a rectangular or substantially rectangular electrode provided on the dielectric layer 2C. The capacitor internal electrode 7B is preferably a rectangular or substantially rectangular electrode provided on the dielectric layer 2D. The right portion of the capacitor internal electrode 7A illustrated in FIG. 3 is opposed to the left portion of the capacitor internal electrode 7B illustrated in FIG. 3 with the dielectric layer 2C interposed therebetween. The input-output via electrode 8 is an electrode that connects a via hole arranged in the dielectric layer 2C to a via hole arranged in the dielectric layer 2D. The input-output via electrode 8 is preferably arranged to be co-axial with the inductor via electrode 6A and connects the capacitor internal electrode 7A to the input-output electrode 3. The ground via electrode 9 is a via hole arranged in the dielectric layer 2D. The ground via electrode 9 is preferably arranged to be co-axial with the inductor via electrode 6B and connects the capacitor internal electrode 7B to the ground electrode 4. Opposed electrode areas of the capacitor internal electrode 7A and the capacitor internal electrode 7B are set in order to generate a required capacitance.

In the multilayer resonator 1 having the above-described structure, each electrode defines an LC parallel resonant circuit.

The input-output electrode 3 and the capacitor internal electrode 7B are arranged herein so that these elements do not overlap each other in a plan view. Since the input-output electrode 3 and the ground electrode 4 are typically produced using the thick-film formation method such as screen printing, for example, large dimensional variations are likely to occur. There are cases when the input-output electrode 3 and the ground electrode 4 are reduced in size, as a result of partial grinding during barrel-polishing of the multilayer body. If the input-output electrode 3 and the capacitor internal electrode 7B are arranged so as to overlap each other, an unwanted capacitance from a design point of view is generated between the input-output electrode 3 and the capacitor internal electrode 7B. Moreover, there is a possibility that variations in electrode shape will lead to variations in capacitance value.

However, if the input-output electrode 3 and the capacitor internal electrode 7B are arranged so as not to overlap each other in a plan view, the generation of the unwanted capacitance is prevented. Even if there are variations in the shape of the input-output electrode 3 and the ground electrode 4, a capacitive component of the LC parallel resonant circuit is stabilized, and variations in resonator characteristics are effectively controlled.

Figure 4:
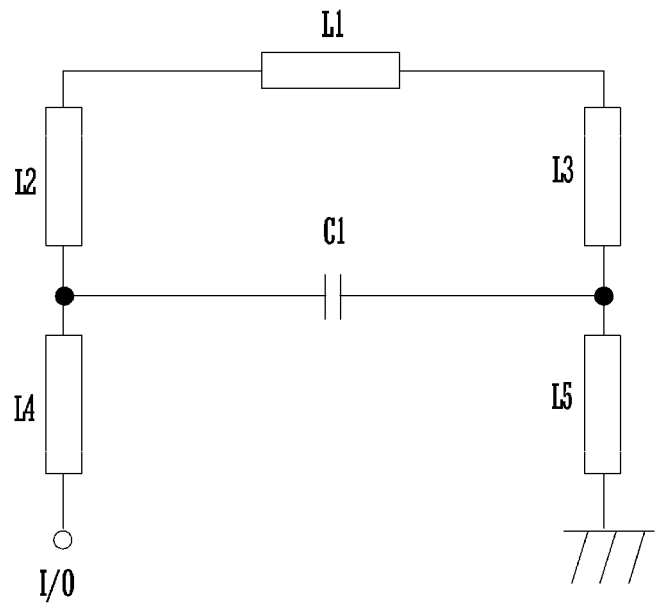
FIG. 4 is an equivalent circuit diagram of the resonator shown in FIG. 2.

FIG. 4 is an equivalent circuit diagram of the multilayer resonator 1. The capacitor internal electrode 7A and the capacitor internal electrode 7B define a capacitance C1. The inductor via electrodes 6A and 6B and the inductor internal electrode 5 are arranged in a loop configuration. The inductor internal electrode 5 defines an inductance L1, the inductor via electrode 6A defines an inductance L2, and the inductor via electrode 6B defines an inductance L3. The capacitor and the inductors define the LC parallel resonant circuit and are connected in parallel between the input-output electrode 3 and the ground electrode 4 via the input-output via electrode 8 and the ground via electrode 9. The input-output electrode 3 is thus connected to the LC parallel resonant circuit. The input-output via electrode 8 defines an inductance L4 and the ground via electrode 9 defines an inductance L5.

With this arrangement, the input-output electrode 3 and the ground electrode 4 are connected to the LC parallel resonant circuit by the via holes. This arrangement provides improved connection reliability as compared to the related art in which an extension line is used. Since the multilayer resonator 1 is configured as the LGA package, a high contact reliability of the electrodes to a mother board is achieved during the mounting of the multilayer resonator 1 to the mother board. During the mounting of the multilayer resonator 1 to the mother board, a soldering operation on the side surface of the multilayer body 2 is omitted and a soldering area is not required on the mother board. The multilayer resonator 1 thus enables a high-density mounting. Since no soldering operation is required during the mounting, a reduction in the number of process steps is achieved.

The inductances L4 and L5 defined by the input-output via electrode 8 and the ground via electrode 9 function as a parasitic inductive component, imparting an unwanted spurious component to the LC parallel resonant circuit. However, the length of each of the input-output via electrode 8 and the length of the ground via electrode 9 are respectively the sum of thicknesses of the dielectric layer 2C and the dielectric layer 2D and the thickness of the dielectric layer 2D. Thus, the open stub length of each of the electrodes degrading attenuation characteristics is relatively short, and the unwanted spurious component affecting the attenuation characteristics of the multilayer resonator 1 is relatively small.

Since the inductor via electrodes 6A and 6B and the inductor internal electrode 5 are disposed within the multilayer body 2, electrode corrosion does not occur during a plating process of the multilayer body 2. For this reason, no filter loss occurs. Since the inductor via electrodes 6A and 6B and the inductor internal electrode 5 are arranged in a loop configuration within the multilayer body 2, the multilayer body 2 is less susceptible to an external magnetic field, and variations in the characteristics are effectively controlled. This arrangement provides excellent shielding and control of unwanted radiations. The multilayer resonator 1 provides stable electrical characteristics stable in high-frequency regions.

The multilayer resonator 1 is herein configured so that a loop plane of the inductors is preferably perpendicular or substantially perpendicular to the short-side direction of the multilayer body 2. Thus, the size of the multilayer resonator 1 is reduced. Alternatively, the loop plane of the inductors may preferably be perpendicular or substantially perpendicular to the long-side direction of the multilayer body 2. The capacitor internal electrode 7B is arranged on the top surface of the dielectric layer 2D which is adjacent to the mounting surface, and the capacitor internal electrode 7A is arranged on the top surface of the dielectric layer 2C which is adjacent to the dielectric layer 2D. Alternatively, the capacitor internal electrode 7B and the capacitor internal electrode 7A may be reversed in the vertical locations thereof.

The capacitor internal electrode 7A is preferably arranged so as not to overlap the ground electrode 4 as viewed from above. Alternatively, the capacitor internal electrode 7A may overlap the ground electrode 4. Since the capacitor internal electrode 7B is arranged between the capacitor internal electrode 7A and the ground electrode 4, an unwanted capacitance is not generated if the two electrodes overlap each other.

Next, a multilayer resonator of a second preferred embodiment of the present invention is described. The multilayer resonator of the second preferred embodiment is different from the multilayer resonator 1 of the first preferred embodiment in that two resonant circuits are arranged in the multilayer body and that two ground electrodes are arranged on the mounting surface.

Figure 5:
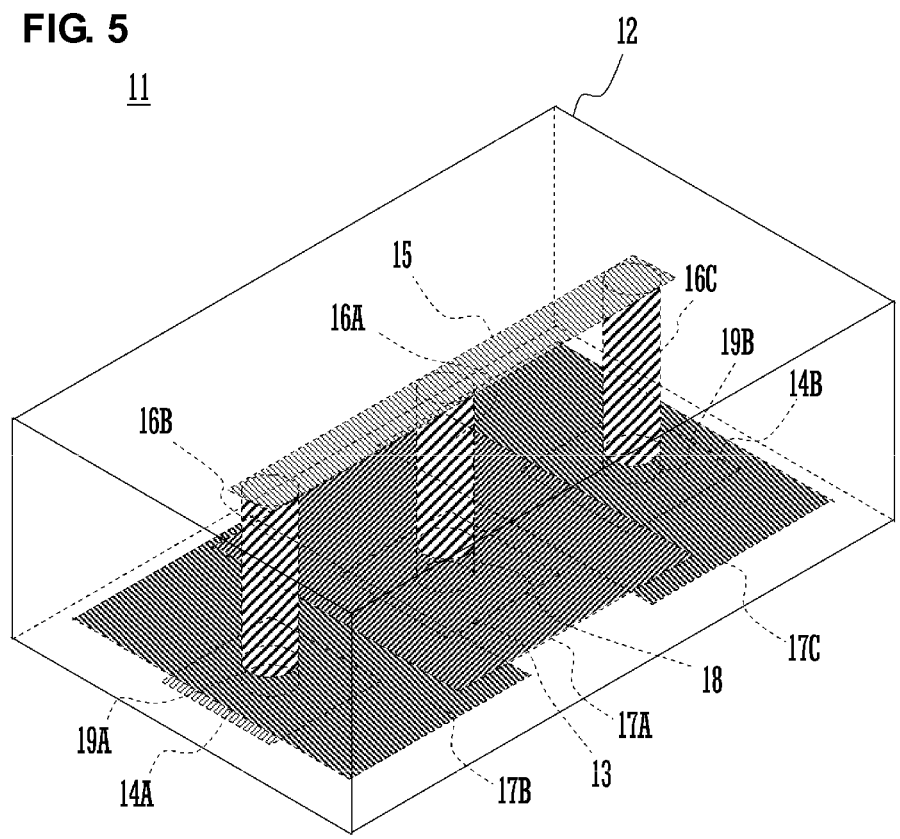
FIG. 5 is a see-through perspective view of a multilayer resonator of a second preferred embodiment of the present invention.
Figure 6:
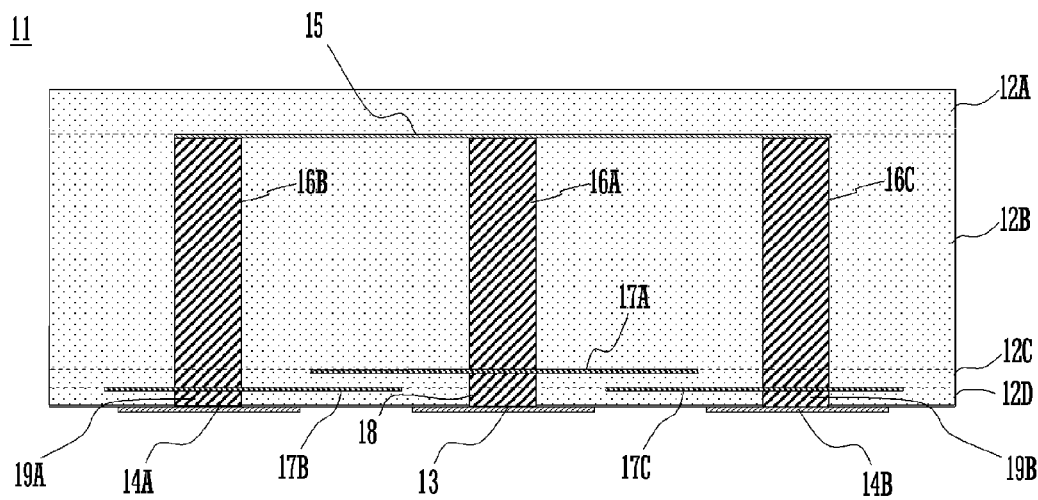
FIG. 6 is a sectional view of the resonator shown in FIG. 5.

FIG. 5 is a see-through perspective view of the resonator, and FIG. 6 is a sectional view of the resonator.

The multilayer resonator 11 includes an input-output electrode 13 and ground electrodes 14A and 14B on the mounting surface of the multilayer body 12. The multilayer body 12 includes a plurality of dielectric layers 12A-12D. An inductor internal electrode 15, inductor via electrodes 16A-16C, capacitor internal electrodes 17A-17C, an input-output via electrode 18, and ground via electrodes 19A and 19B are arranged in the multilayer body 12.

The inductor internal electrode 15 is a line electrode arranged on the dielectric layer 12B. The inductor via electrode 16A is a via hole arranged in the dielectric layer 12B. The inductor via electrode 16A is arranged below the center portion of the inductor internal electrode 15 and connects the inductor internal electrode 15 to the capacitor internal electrode 17A. Each of the inductor via electrodes 16B and 16C is formed by connecting a via hole in the dielectric layer 12B to a via hole in the dielectric layer 12C. The inductor via electrodes 16B and 16C are arranged below the two end portions of the inductor internal electrode 15 and connects the inductor internal electrode 15 to the capacitor internal electrodes 17B and 17C. The capacitor internal electrode 17A is preferably a rectangular or substantially rectangular electrode provided on the dielectric layer 12C. The capacitor internal electrodes 17B and 17C are rectangular or substantially rectangular electrodes provided on the dielectric layer 12D. The two end portions of the capacitor internal electrode 17A are respectively opposed to a portion of the capacitor internal electrode 17B and a portion of the capacitor internal electrode 17C with the dielectric layer 12C interposed therebetween. The portion of the capacitor internal electrode 17B and the portion of the capacitor internal electrode 17C are portions arranged close to the center of the multilayer body 2. The input-output via electrode 18 is formed by connecting a via hole in the dielectric layer 12C to a via hole in the dielectric layer 12D. The input-output via electrode 18 is preferably arranged to be co-axial with the inductor via electrode 16A and connects the capacitor internal electrode 17A to the input-output electrode 13. The ground via electrodes 19A and 19B are defined by via holes arranged in the dielectric layer 12D. The ground via electrodes 19A and 19B are preferably arranged to be co-axial with the inductor via electrodes 16B and 16C, respectively, and connect the capacitor internal electrodes 17B and 17C to the ground electrodes 14A and 14B, respectively.

The multilayer resonator 11 has a circuit arrangement including two LC parallel resonant circuits that are connected in parallel.

The input-output electrode 13 and the capacitor internal electrodes 17B and 17C are preferably arranged so as not to overlap when viewed from above. In this manner, the generation of the above-described unwanted capacitance is prevented. Even if the shape of the input-output electrode 13 is changed, the capacitive component of the LC parallel resonant circuit is stabilized, and variations in the resonant characteristics are effectively controlled.

Figure 7:
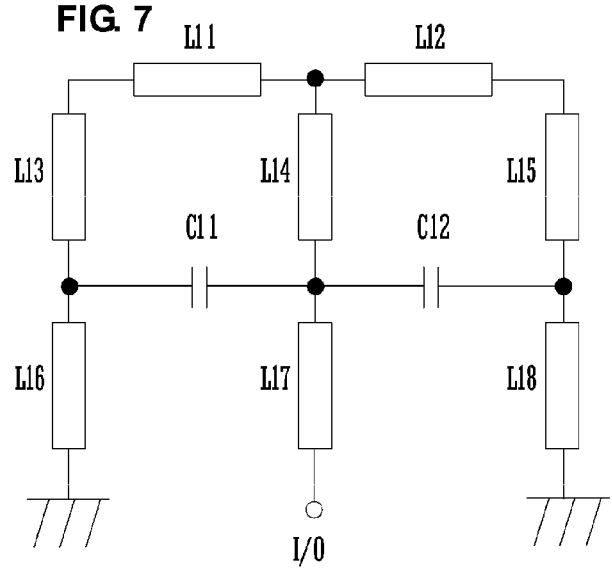
FIG. 7 is an equivalent circuit diagram of the resonator shown in FIG. 5.

FIG. 7 is an equivalent circuit diagram of the multilayer resonator 11. The capacitor internal electrode 17A and the capacitor internal electrode 17B define a capacitance C11. The inductor via electrodes 16B and 16C and the inductor internal electrode 15 are arranged in a loop configuration. A portion of the inductor internal electrode 15 defines an inductance L11, the inductor via electrode 16A defines an inductance L14, and the inductor via electrode 16B defines an inductance L13. The capacitor and the inductors define a first LC parallel resonant circuit, and are connected in parallel between the input-output electrode 13 and the ground electrode 14A by the input-output via electrode 18 and the ground via electrode 19A.

The capacitor internal electrode 17A and the capacitor internal electrode 17C define a capacitance C12. The inductor via electrodes 16A and 16C and the inductor internal electrode 15 are arranged in a loop configuration. A portion of the inductor internal electrode 15 defines the inductance L12, the inductor via electrode 16A defines the inductance L14, and the inductor via electrode 16C defines an inductance L15. The capacitor and the inductors define a second LC parallel resonant circuit, and are connected in parallel between the input-output electrode 13 and the ground electrode 14B by the input-output via electrode 18 and the ground via electrode 19B.

With the above-described circuit arrangement, the multilayer resonator 11 functions as a resonant circuit that includes the two LC parallel resonant circuits connected in parallel.

The input-output via electrode 18 defines an inductance L17, the ground via electrode 19A defines an inductance L16, and the ground via electrode 19B defines an inductance L18. Although these inductances function as parasitic inductive components, the length of each electrode is relatively short, and the open stub length of each of these electrodes degrading attenuation characteristics is short. Thus, the unwanted spurious effect affecting the attenuation characteristics of the multilayer resonator 11 is small.

Preferred embodiments of the present invention can be embodied regardless of the structure of the resonant circuit arranged within the multilayer body, and the effect of the unwanted spurious component to the attenuation characteristics of the multilayer resonator is effectively controlled. Since the inductor via electrodes and the inductor internal electrode are arranged in a loop configuration within the multilayer body, electrode corrosion is prevented during the plating process, and the influence of an external magnetic field is effectively controlled. Variations in the characteristics are also effectively controlled.

A multilayer filter of a third preferred embodiment of the present invention is described. The multilayer filter of the third preferred embodiment is different from the structure of the first preferred embodiment in that two resonant circuits are arranged within the multilayer body. Each resonant circuit has the same or substantially the same circuit arrangement as the resonant circuit of the first preferred embodiment.

Figure 8:
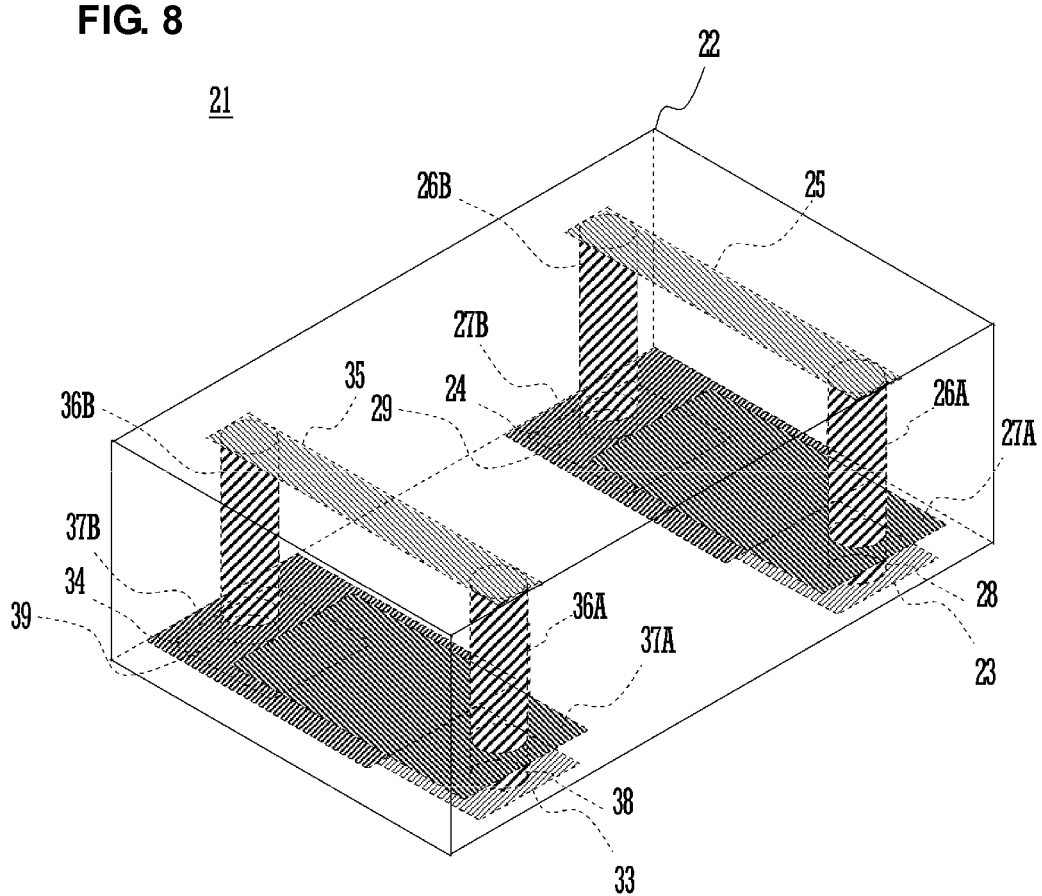
FIG. 8 is a see-through perspective view of a multilayer filter of a third preferred embodiment of the present invention.

FIG. 8 is a see-through perspective view of the filter according to the third preferred embodiment.

The multilayer filter 21 includes input-output electrodes 23 and 33 and ground electrodes 24 and 34 on the mounting surface of a multilayer body 22. Inductor internal electrodes 25 and 35, inductor via electrodes 26A, 26B, 36A, and 36B, capacitor internal electrodes 27A, 27B, 37A, and 37B, input-output via electrodes 28 and 38, and ground via electrodes 29 and 39 are arranged within the multilayer body 22.

A first LC parallel resonant circuit includes the input-output electrode 23, the ground electrode 24, the inductor internal electrode 25, the inductor via electrodes 26A and 26B, the capacitor internal electrodes 27A and 27B, the input-output via electrode 28, and the ground via electrode 29.

A second LC parallel resonant circuit includes the input-output electrode 33, the ground electrode 34, the inductor internal electrode 35, the inductor via electrodes 36A and 36B, the capacitor internal electrodes 37A and 37B, the input-output via electrode 38, and the ground via electrode 39.

The first LC parallel resonant circuit and the second LC parallel resonant circuit are arranged within the multilayer body 22 so that the loop planes of the circuits face each other. The loops overlap each other as viewed in the direction of the arrangement.

In the multilayer filter 21, a magnetic field flux passing through the loops are shared by the first LC parallel resonant circuit and the second LC parallel resonant circuit, and the two LC resonant circuits are magnetically coupled accordingly.

The input-output electrode 23 and the capacitor internal electrode 27B are arranged so as not to overlap each other when viewed from above. The input-output electrode 33 and the capacitor internal electrode 37B are arranged so as not to overlap each other when viewed from above. This arrangement effectively controls the generation of an unwanted capacitance. Even if the shapes of the input-output electrodes 23 and 33 are changed, the capacitive component of the LC parallel resonant circuits remains stable, and variations in the resonator characteristics are effectively controlled.

Figure 9:
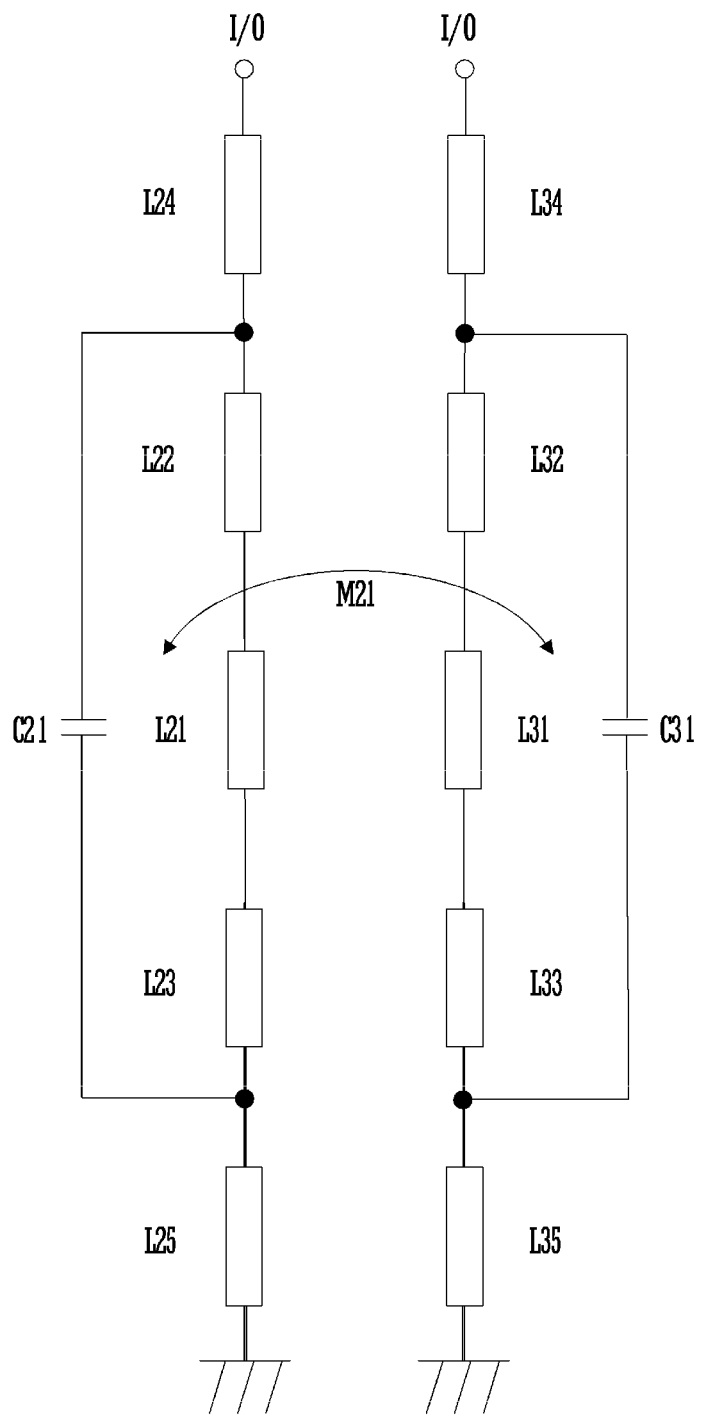
FIG. 9 is an equivalent circuit diagram of the filter shown in FIG. 8.

FIG. 9 is an equivalent circuit diagram of the multilayer filter 21. The capacitor internal electrode 27A and the capacitor internal electrode 27B define a capacitance C21. The inductor via electrodes 26A and 26B and the inductor internal electrode 25 are arranged in a loop configuration. The inductor internal electrode 25 defines an inductance L21, the inductor via electrode 26A defines an inductance L22, and the inductor via electrode 26B defines an inductance L23. The capacitor and the inductors define the first LC parallel resonant circuit and are connected in parallel between the input-output electrode 23 and the ground electrode 24 via the input-output via electrode 28 and the ground via electrode 29.

The capacitor internal electrode 37A and the capacitor internal electrode 37B define a capacitance C31. The inductor via electrodes 36A and 36B and the inductor internal electrode 35 are arranged in a loop configuration. The inductor internal electrode 35 defines an inductance L31, the inductor via electrode 36A defines an inductance L32, and the inductor via electrode 36B defines an inductance L33. The capacitor and the inductors define the second LC parallel resonant circuit and are connected in parallel between the input-output electrode 33 and the ground electrode 34 by the input-output via electrode 38 and the ground via electrode 39.

The input-output electrode 23 is connected to the first LC parallel resonant circuit and the input-output electrode 33 is connected to the second LC parallel resonant circuit, and the LC parallel resonant circuits respectively define resonant circuits at the input-output stages. The overlapping of the loops of the LC parallel resonant circuits generates a magnetic coupling M21.

The multilayer filter 21 with the above-described circuit arrangement functions as a bandpass filter including the two-stage LC parallel resonant circuits.

The input-output via electrode 28 defines an inductance L24, the input-output via electrode 38 defines an inductance L34, the ground via electrode 29 defines an inductance L25, and the ground via electrode 39 defines an inductance L35. Although these inductances function as parasitic inductive components, the length of each electrode is short, and the open stub length of each of these electrodes degrading attenuation characteristics is short. Thus, the unwanted spurious effect affecting the attenuation characteristics of the multilayer resonator 21 is small.

The multilayer filter 21 of preferred embodiments of the present invention can be embodied regardless of the structure of the resonant circuits arranged within the multilayer body, and the effect of the unwanted spurious component to the attenuation characteristics of the multilayer resonator is effectively controlled. Since the inductor via electrodes and the inductor internal electrodes are arranged in a loop configuration within the multilayer body, electrode corrosion is prevented during the plating process, and the influence of an external magnetic field is effectively controlled. Thus, variations in the characteristics are effectively controlled.

A multilayer filter of a fourth preferred embodiment of the present invention is described. The multilayer filter of the fourth preferred embodiment is different from the structure of the third preferred embodiment in that a resonant circuit at an intermediate stage is provided in the multilayer body.

Figure 10:
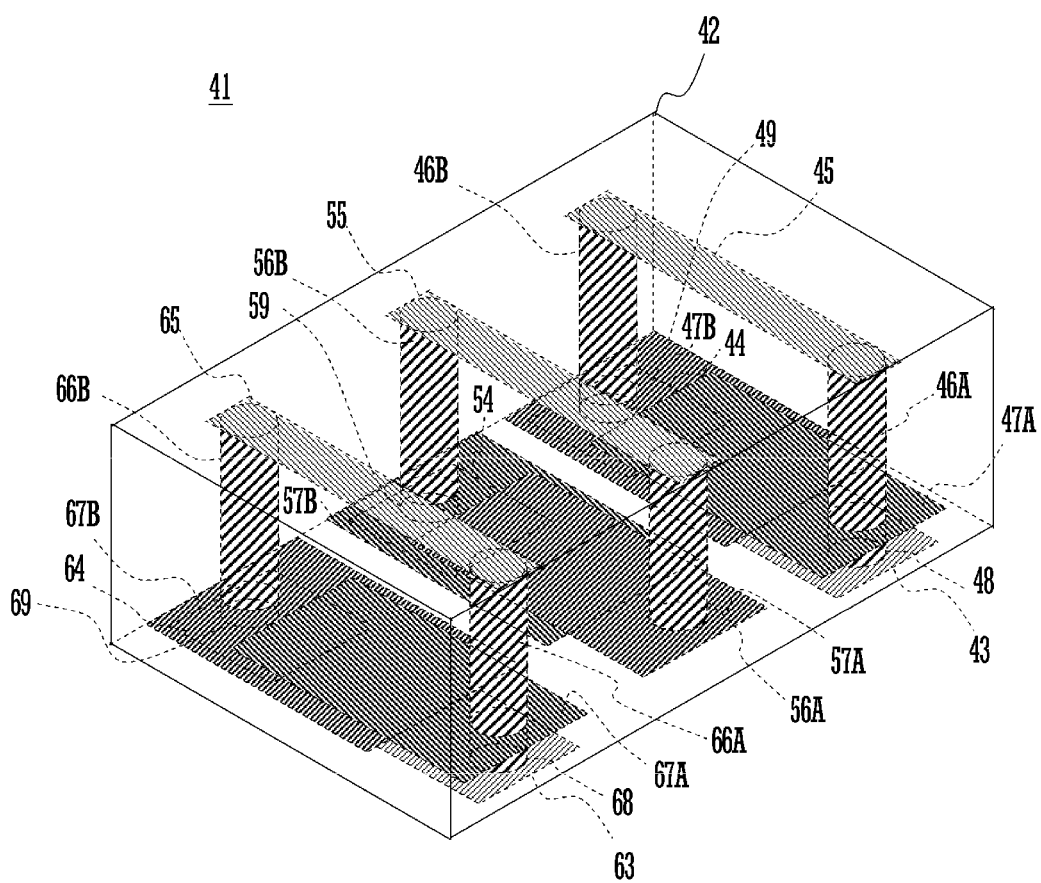
FIG. 10 is a see-through perspective view of a multilayer filter of a fourth preferred embodiment of the present invention.

FIG. 10 is a see-through perspective view of the filter.

The multilayer filter 41 includes input-output electrodes 43 and 63, and ground electrodes 44, 54, and 64 on the mounting surface of a multilayer body 42. Inductor internal electrodes 45, 55, and 65, inductor via electrodes 46A, 46B, 56A, 56B, 66A and 66B, capacitor internal electrodes 47A, 47B, 57A, 57B, 67A, and 67B, input-output via electrodes 48 and 68, and ground via electrodes 49, 59, and 69 are arranged within the multilayer body 42.

An LC parallel resonant circuit at a first input-output stage includes the input-output electrode 43, the ground electrode 44, the inductor internal electrode 45, the inductor via electrodes 46A and 46B, the input-output via electrode 48, and the ground via electrode 49.

An LC parallel resonant circuit at an intermediate stage includes the ground electrode 54, the inductor internal electrode 55, the inductor via electrodes 56A and 56B, the capacitor internal electrodes 57A and 57B, and the ground via electrode 59. The LC parallel resonant circuit at the intermediate stage includes neither an input-output via electrode nor an input-output electrode.

A second LC parallel resonant circuit at an input-output stage includes the input-output electrode 63, the ground electrode 64, the inductor internal electrode 65, the inductor via electrodes 66A and 66B, the capacitor internal electrodes 67A and 67B, the input-output via electrode 68, and the ground via electrode 69.

The three LC parallel resonant circuits are arranged within the multilayer body 42 so that the loop planes thereof are opposed to each other. The loop planes overlap each other when viewed in the arrangement direction.

In the multilayer filter 41, a magnetic field flux passing through the loops are shared by the three LC parallel resonant circuits, and two adjacent LC resonant circuits are magnetically coupled.

The input-output electrode 43 and the capacitor internal electrode 47B are arranged so as not to overlap each other when viewed from above. The input-output electrode 63 and the capacitor internal electrode 67B are arranged so as not to overlap each other when viewed from above. This arrangement effectively controls the generation of an unwanted capacitance. Even if the shapes of the input-output electrodes 43 and 63 are changed, the capacitive component of the LC parallel resonant circuits remains stable, and variations in the resonator characteristics are effectively controlled.

Figure 11:
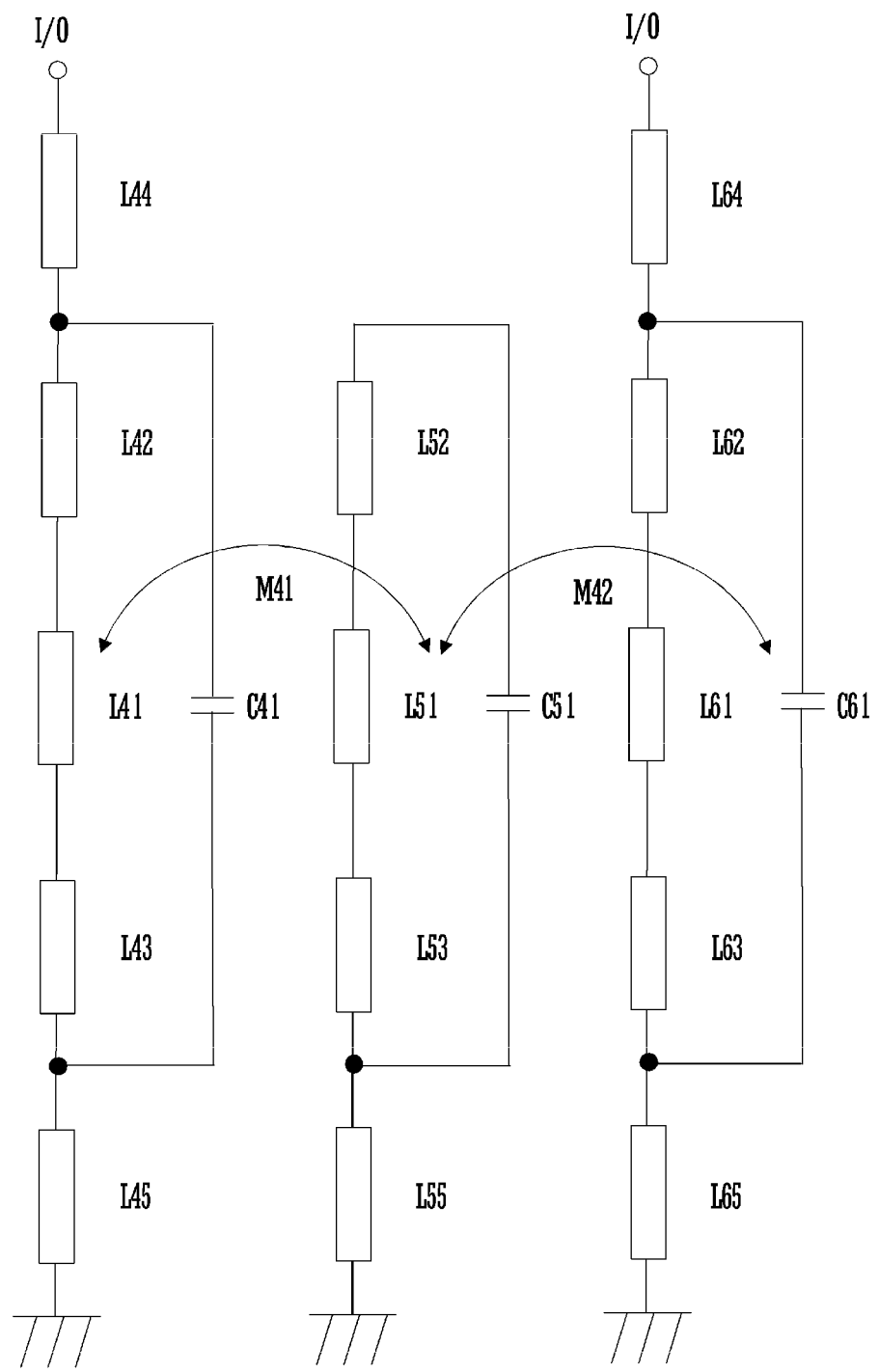
FIG. 11 is an equivalent circuit diagram of the filter shown in FIG. 10.

FIG. 11 is an equivalent circuit diagram of the multilayer filter 41. The capacitor internal electrode 47A and the capacitor internal electrode 47B define a capacitance C41. The inductor via electrodes 46A and 46B and the inductor internal electrode 45 are arranged in a loop configuration. The inductor internal electrode 45 defines an inductance L41, the inductor via electrode 46A defines an inductance L42, and the inductor via electrode 46B defines an inductance L43. The capacitor and the inductors define a LC parallel resonant circuit at a first input-output stage and are connected in parallel between the input-output electrode 43 and the ground electrode 44 via the input-output via electrode 48 and the ground via electrode 49.

The capacitor internal electrode 57A and the capacitor internal electrode 57B define a capacitance C51. The inductor via electrodes 56A and 56B and the inductor internal electrode 55 are arranged in a loop configuration. The inductor internal electrode 55 defines an inductance L51, the inductor via electrode 56A defines an inductance L52, and the inductor via electrode 56B defines an inductance L53. The capacitor and the inductors define an LC parallel resonant circuit at an intermediate stage, and are connected to the ground electrode 54 via the ground via electrode 59.

The capacitor internal electrode 67A and the capacitor internal electrode 67B define a capacitance C61. The inductor via electrodes 66A and 66B and the inductor internal electrode 65 are arranged in a loop configuration. The inductor internal electrode 65 defines an inductance L61, the inductor via electrode 66A defines an inductance L62, and the inductor via electrode 66B defines an inductance L63. The capacitor and the inductors define a LC parallel resonant circuit at a second input-output stage and are connected in parallel between the input-output electrode 63 and the ground electrode 64 via the input-output via electrode 68 and the ground via electrode 69.

The input-output electrode 43 is connected to the LC parallel resonant circuit at the first input-output stage, and the input-output electrode 63 is connected to the LC parallel resonant circuit at the second input-output stage. The overlapping of the LC parallel resonant circuits generates magnetic couplings M41 and M42.

The multilayer filter 41 with the circuit arrangement described above functions as a bandpass filter including the three-stage LC parallel resonant circuits.

The input-output via electrode 48 defines an inductance L44, the input-output via electrode 68 defines an inductance L64, and the ground via electrode 49 defines an inductance L45. The ground via electrode 59 defines an inductance L55, and the ground via electrode 69 defines an inductance L65. Although these inductances function as parasitic inductive components, the length of each electrode is short, and the open stub length of each of these electrodes degrading attenuation characteristics is short. Thus, the unwanted spurious effect affecting the attenuation characteristics of the multilayer filter 41 is small.

The multilayer filter of preferred embodiments of the present invention can be embodied regardless of the structure of the resonant circuits arranged within the multilayer body, and the effect of the unwanted spurious component to the attenuation characteristics of the multilayer resonator is effectively controlled. Since the inductor via electrodes and the inductor internal electrodes are arranged in a loop configuration within the multilayer body, electrode corrosion is prevented during the plating process, and the influence of an external magnetic field is effectively controlled. Thus, variations in the characteristics are effectively controlled.

A multilayer filter of a fifth preferred embodiment of the present invention is described below. The multilayer filter of the fifth preferred embodiment is different from the structure of the fourth preferred embodiment in that the resonant circuit at the intermediate stage is reversed in direction.

Figure 12:
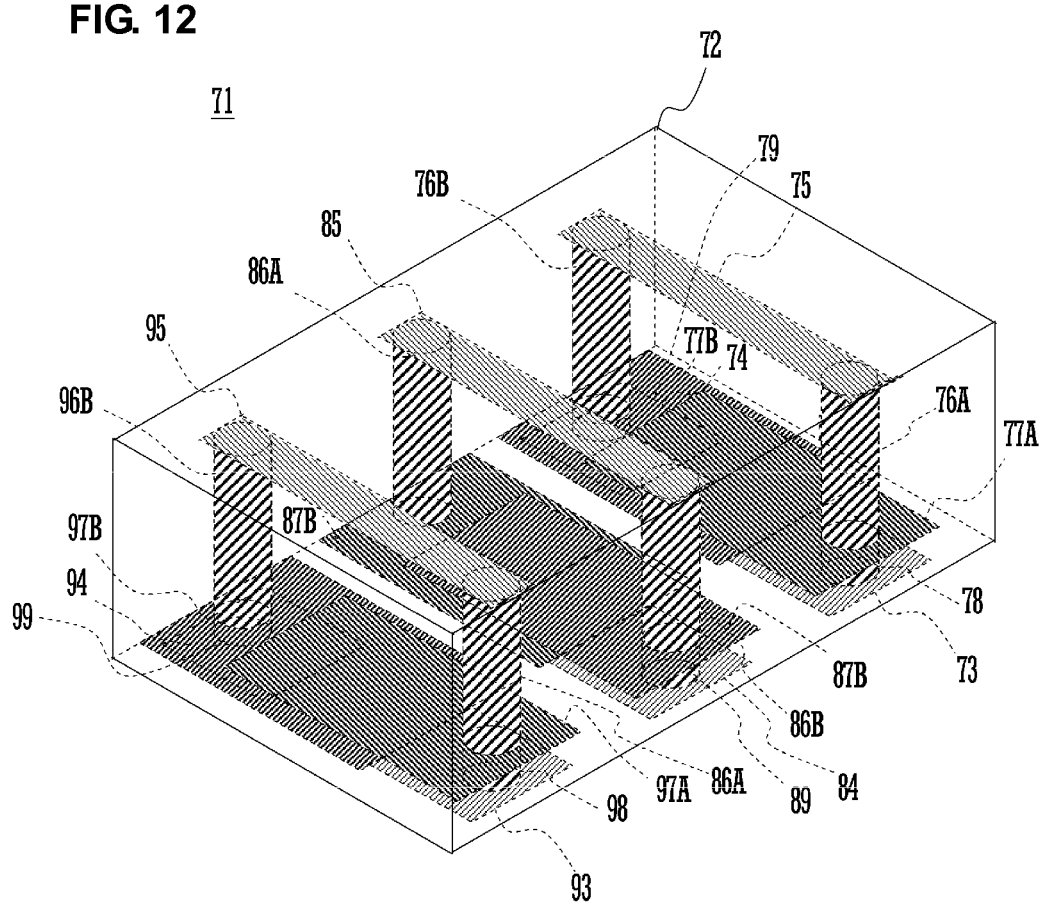
FIG. 12 is a see-through perspective view of a multilayer filter of a fifth preferred embodiment of the present invention.

FIG. 12 is a see-through perspective view of the filter.

The multilayer filter 71 includes input-output electrodes 73 and 93 and ground electrodes 74, 84, and 94 on the mounting surface of a multilayer body 72. Inductor internal electrodes 75, 85, and 95, inductor via electrodes 76A, 76B, 86A, 86B, 96A, and 96B, capacitor internal electrodes 77A, 77B, 87A, 87B, 97A, and 97B, input-output via electrode 78 and 98, and ground via electrodes 79, 89, and 99 are arranged within the multilayer body 72.

A LC parallel resonant circuit at a first input-output stage includes the input-output electrode 73, the ground electrode 74, the inductor internal electrode 75, the inductor via electrodes 76A and 76B, the capacitor internal electrodes 77A and 77B, the input-output via electrode 78, and the ground via electrode 79.

An LC parallel resonant circuit at an intermediate stage includes the ground electrode 84, the inductor internal electrode 85, the inductor via electrodes 86A and 86B, the capacitor internal electrodes 87A and 87B, and the ground via electrode 89. The LC parallel resonant circuit at the intermediate stage includes neither an input-output via electrode nor an input-output electrode.

A LC parallel resonant circuit at a second input-output stage includes the input-output electrode 93, the ground electrode 94, the inductor internal electrode 95, the inductor via electrodes 96A and 96B, the capacitor internal electrodes 97A and 97B, the input-output via electrode 98, and the ground via electrode 99.

The three LC parallel resonant circuits are arranged within the multilayer body 72 so that the loop planes thereof are opposed to each other. The loop planes overlap each other when viewed in the arrangement direction. The loop of the LC parallel resonant circuit at the intermediate stage is opposite in direction to the loops of the LC parallel resonant circuits at the input-output stages. The ground electrode 84 of the resonant circuit at the intermediate stage is arranged between the input-output electrodes 73 and 93. This arrangement improves isolation between the input-output electrodes 73 and 93.

In the multilayer filter 71, a magnetic field flux passing through the loops are shared by the three LC parallel resonant circuits, and two adjacent LC resonant circuits are thus magnetically coupled.

The input-output electrode 73 and the capacitor internal electrode 77B are arranged so as not to overlap each other when viewed from above. The input-output electrode 93 and the capacitor internal electrode 97B are arranged so as not to overlap each other when viewed from above. This arrangement controls the generation of an unwanted capacitance. Even if the shapes of the input-output electrodes 73 and 93 are changed, the capacitive component of the LC parallel resonant circuits remains stable, and variations in the resonator characteristics are effectively controlled.

Figure 13:
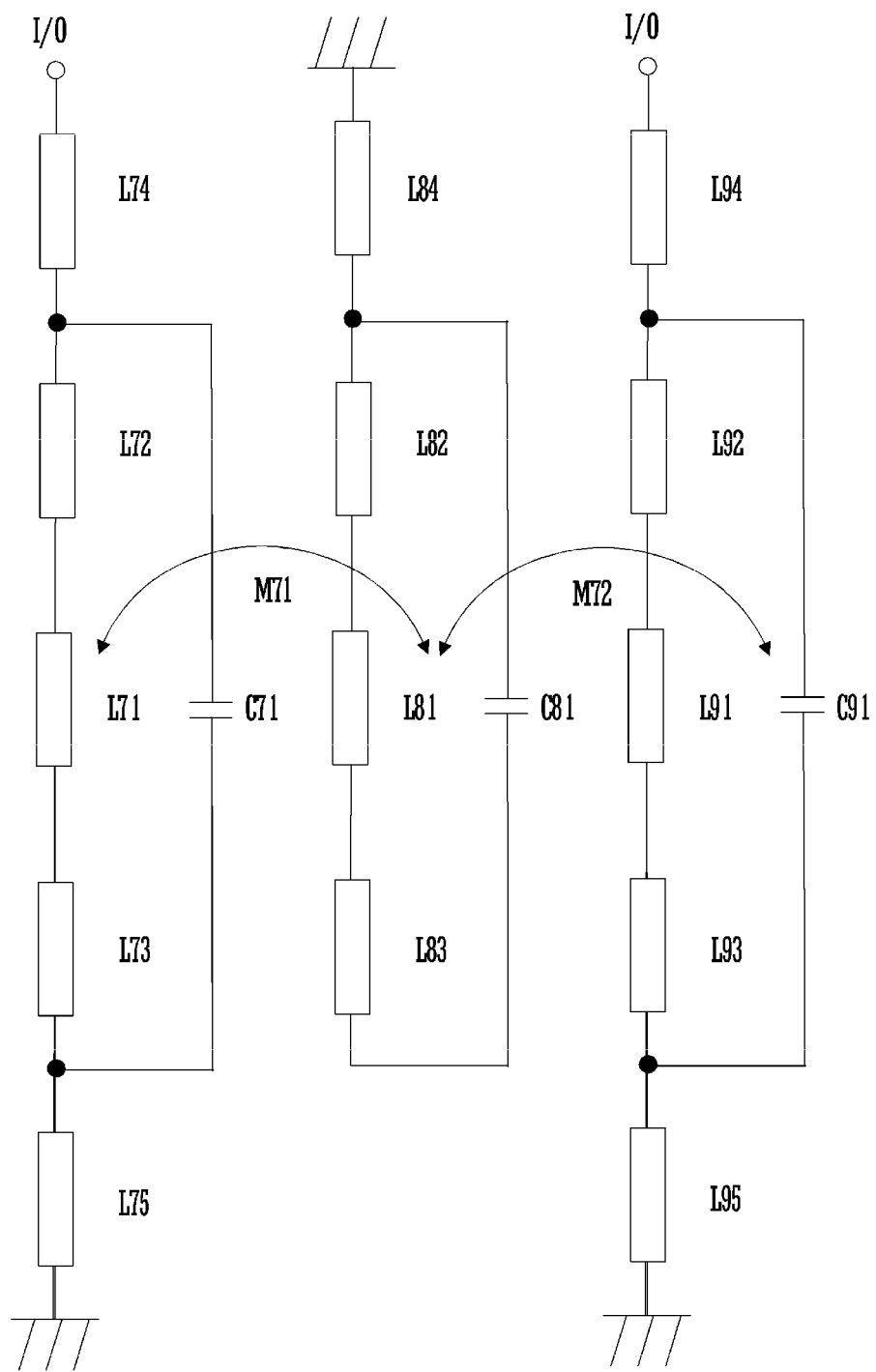
FIG. 13 is an equivalent circuit diagram of the filter shown in FIG. 12.

FIG. 13 is an equivalent circuit diagram of the multilayer filter 71. The capacitor internal electrode 77A and the capacitor internal electrode 77B define a capacitance C71. The inductor via electrodes 76A and 76B and the inductor internal electrode 75 are arranged in a loop configuration. The inductor internal electrode 75 defines an inductance L71, the inductor via electrode 76A defines an inductance L72, and the inductor via electrode 76B defines an inductance L73. The capacitor and the inductors define the LC parallel resonant circuit at the first input-output stage and are connected in parallel between the input-output electrode 73 and the ground electrode 74 via the input-output via electrode 78 and the ground via electrode 79.

The capacitor internal electrode 87A and the capacitor internal electrode 87B define a capacitance C81. The inductor via electrodes 86A and 86B and the inductor internal electrode 85 are arranged in a loop configuration. The inductor internal electrode 85 defines an inductance L81, the inductor via electrode 86A defines an inductance L82, and the inductor via electrode 86B defines an inductance L83. The capacitor and the inductors define the LC parallel resonant circuit at the intermediate stage, and are connected to the ground electrode 84 via the ground via electrode 89.

The capacitor internal electrode 97A and the capacitor internal electrode 97B define a capacitance C91. The inductor via electrodes 96A and 96B and the inductor internal electrode 95 are arranged in a loop configuration. The inductor internal electrode 95 defines an inductance L91, the inductor via electrode 96A defines an inductance L92, and the inductor via electrode 96B defines an inductance L93. The capacitor and the inductors define the LC parallel resonant circuit at the second input-output stage and are connected in parallel between the input-output electrode 93 and the ground electrode 94 via the input-output via electrode 98 and the ground via electrode 99.

The input-output electrode 73 is connected to the LC parallel resonant circuit at the first input-output stage, and the input-output electrode 93 is connected to the LC parallel resonant circuit at the second input-output stage. The overlapping of the LC parallel resonant circuits generates magnetic couplings M71 and M72.

The multilayer filter 71 with the circuit arrangement described above functions as a bandpass filter including the three-stage LC parallel resonant circuits.

The input-output via electrode 78 defines an inductance L74, the input-output via electrode 98 defines an inductance L94, and the ground via electrode 79 defines an inductance L75. The ground via electrode 89 defines an inductance L84, and the ground via electrode 99 defines an inductance L95. Although these inductances function as parasitic inductive components, the length of each electrode is short, and the open stub length of each of these electrodes degrading attenuation characteristics is short. Thus, the unwanted spurious effect affecting the attenuation characteristics of the multilayer filter 71 is small.

Figure 14:
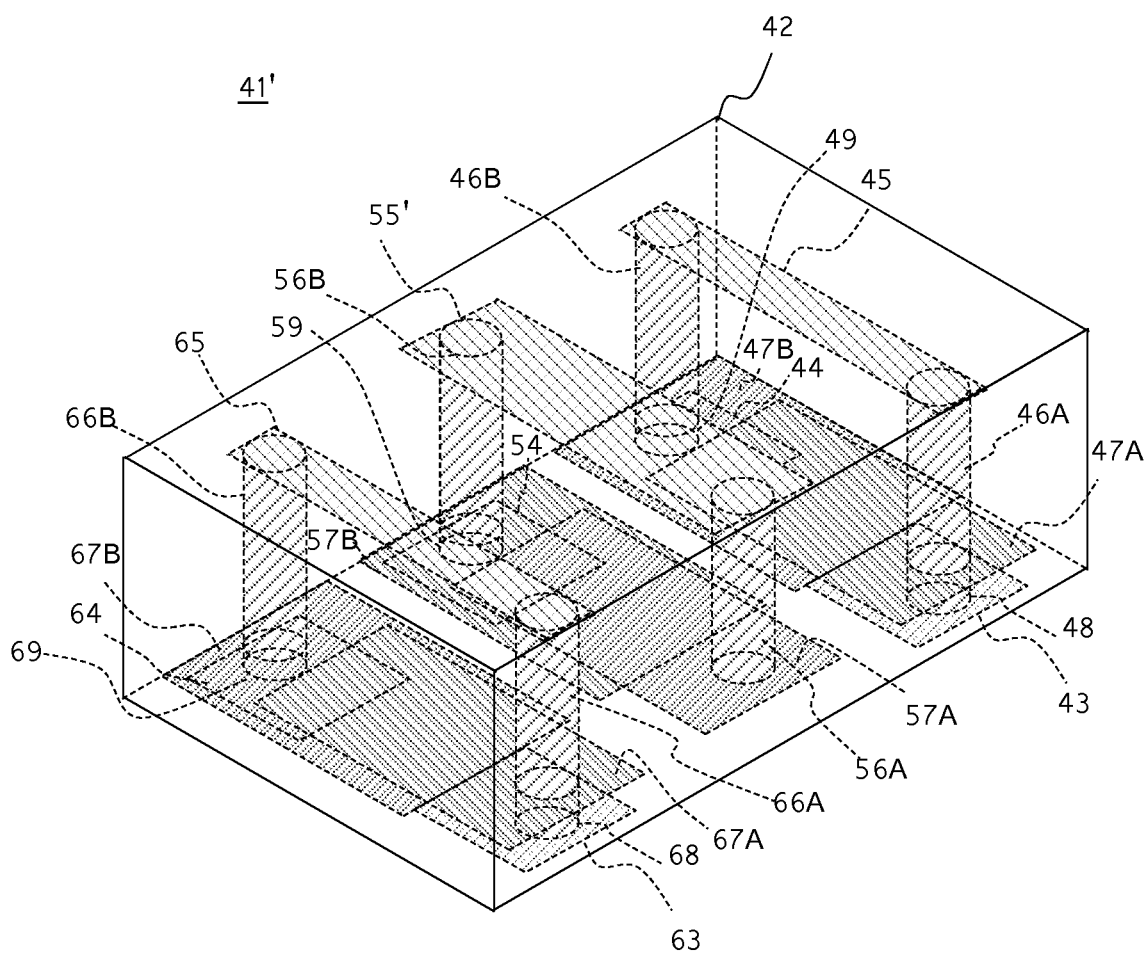
FIG. 14 is a see-through perspective view of a multilayer filter according to a modification of the fourth preferred embodiment of the present invention.

FIG. 14 is a see-through perspective view of a filter 41' according to a modification of the fourth preferred embodiment of the present invention. The filter 41' shown in FIG. 14 is substantially the same as the filter 41 shown in FIG. 10, except that the inductor internal electrode 55' has an electrode width that is different from the electrode widths of the inductor internal electrodes 45 and 65.

Figure 15:
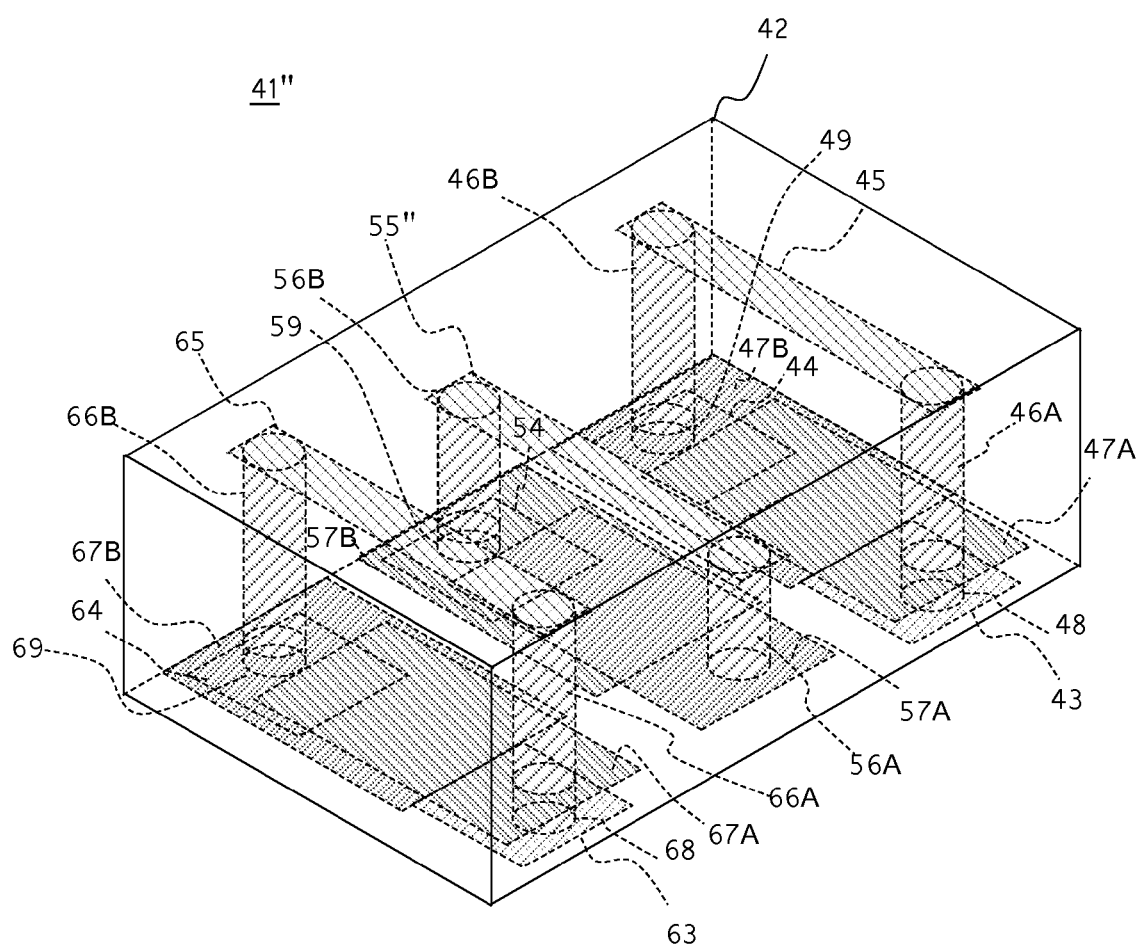
FIG. 15 is a see-through perspective view of a multilayer filter according to another modification of the fourth preferred embodiment of the present invention.

FIG. 15 is a see-through perspective view of a filter 41'' according to another modification of the fourth preferred embodiment of the present invention. The filter 41'' shown in FIG. 15 is substantially the same as the filter 41 shown in FIG. 10, except that the inductor internal electrode 55'' is provided on a different dielectric layer of the multilayer body 42 from dielectric layer on which the inductor internal electrodes 45 and 65 are provided.

The multilayer filter of preferred embodiments of the present invention can be embodied regardless of the structure of the resonant circuits arranged within the multilayer body, and the effect of the unwanted spurious component to the attenuation characteristics of the multilayer resonator is effectively controlled. Since the inductor via electrodes and the inductor internal electrodes are arranged in a loop configuration within the multilayer body, electrode corrosion is prevented during the plating process, and the influence of an external magnetic field is effectively controlled. Thus, variations in the characteristics are effectively controlled.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer resonator comprising:
a multilayer body defined by a laminate including a plurality of dielectric layers;
first and second mounting surface electrodes defining a ground electrode or an input-output electrode and being provided on a mounting surface of the multilayer body, the mounting surface extending in a direction perpendicular or substantially perpendicular to a lamination direction of the plurality of dielectric layers;
first and second capacitor internal electrodes provided on different ones of the plurality of dielectric layers and arranged to oppose each other in the lamination direction of the plurality of dielectric layers;
an inductor internal electrode provided on only one of the plurality of dielectric layers that is different from the ones of the plurality of dielectric layers including the first and second capacitor internal electrodes provided thereon;
a first inductor via electrode directly physically and electrically connected to the inductor internal electrode and the first capacitor internal electrode;
a second inductor via electrode directly physically and electrically connected to the inductor internal electrode and the second capacitor internal electrode;
a first mounting surface connection via electrode directly physically and electrically connected to the first capacitor internal electrode and to the first mounting surface electrode; and
a second mounting surface connection via electrode directly physically and electrically connected to the second capacitor internal electrode and to the second mounting surface electrode; wherein
the first capacitor internal electrode is located closer to the mounting surface than the second capacitor internal electrode and is arranged so that the first capacitor internal electrode does not overlap the second mounting surface electrode when viewed in the lamination direction of the plurality of dielectric layers; and
the second capacitor internal electrode overlaps the first mounting surface electrode when viewed in the lamination direction of the plurality of dielectric layers.

2. A multilayer resonator comprising:
a multilayer body defined by a laminate including a plurality of dielectric layers;
first and second mounting surface electrodes defining a ground electrode or an input-output electrode and being provided on a mounting surface of the multilayer body, the mounting surface extending in a direction perpendicular or substantially perpendicular to a lamination direction of the plurality of dielectric layers;
first and second capacitor internal electrodes provided on different ones of the plurality of dielectric layers and arranged to oppose each other in the lamination direction of the plurality of dielectric layers;
an inductor internal electrode provided on only one of the plurality of dielectric layers that is different from the ones of the plurality of dielectric layers including the first and second capacitor internal electrodes provided thereon;
a first inductor via electrode directly physically and electrically connected to the inductor internal electrode and the first capacitor internal electrode;
a second inductor via electrode directly physically and electrically connected to the inductor internal electrode and the second capacitor internal electrode;
a first mounting surface connection via electrode directly physically and electrically connected to the first capacitor internal electrode and to the first mounting surface electrode; and
a second mounting surface connection via electrode directly physically and electrically connected to the second capacitor internal electrode and to the second mounting surface electrode; wherein
the first capacitor internal electrode is located closer to the mounting surface than the second capacitor internal electrode and is arranged so that the first capacitor internal electrode does not overlap the second mounting surface electrode when viewed in the lamination direction of the plurality of dielectric layers; and
the first capacitor internal electrode is provided on one of the plurality of dielectric layers that includes the mounting surface.

3. The multilayer resonator according to claim 2, wherein the second capacitor internal electrode overlaps the first mounting surface electrode when viewed in the lamination direction of the plurality of dielectric layers.

4. A multilayer filter comprising:
a multilayer body defined by a laminate including a plurality of dielectric layers and including a plurality of mutually coupled resonant circuits within the multilayer body;
first and second mounting surface electrodes each defining a ground electrode or an input-output electrode and being provided on a mounting surface of the multilayer body, the mounting surface extending in a direction perpendicular or substantially perpendicular to a lamination direction of the plurality of dielectric layers; wherein
at least one of the plurality of resonant circuits includes:
first and second capacitor internal electrodes provided on different ones of the plurality of dielectric layers and arranged to oppose each other in the lamination direction of the plurality of dielectric layers;
an inductor internal electrode provided on only one of the plurality of dielectric layers that is different from the ones of the plurality of dielectric layers including the first and second capacitor internal electrodes provided thereon;
a first inductor via electrode directly physically and electrically connected to the inductor internal electrode and the first capacitor internal electrode;
a second inductor via electrode directly physically and electrically connected to the inductor internal electrode and the second capacitor internal electrode;
at least one of a first mounting surface connection via electrode directly physically and electrically connected to the first capacitor internal electrode and to one of the first mounting surface electrodes and a second mounting surface connection via electrode directly physically and electrically connected to the second capacitor internal electrode and to one of the second mounting surface electrodes;
the first capacitor internal electrode is located closer to the mounting surface than the second capacitor internal electrode and is arranged so that the first capacitor internal electrode does not overlap a respective one of the second mounting surface electrodes when viewed in the lamination direction of the plurality of dielectric layers; and
the second capacitor internal electrode overlaps the first mounting surface electrode when viewed in the lamination direction of the plurality of dielectric layers.

5. The multilayer filter according to claim 4, wherein
the first inductor via electrode and the first mounting surface connection via electrode are co-axially arranged; and
the second inductor via electrode and the second mounting surface connection via electrode are co-axially arranged.

6. The multilayer filter according to claim 4, wherein
each of the plurality of resonant circuits is arranged perpendicular or substantially perpendicular to the lamination direction of the plurality of dielectric layers; and
loops, each defined by the inductor internal electrode, the first inductor via electrode, and the second inductor via electrode in each of the plurality of resonant circuits, overlap each other when viewed from a direction perpendicular to the lamination direction of the plurality of dielectric layers.

7. The multilayer filter according to claim 4, wherein at least one of the inductor internal electrodes of the plurality of resonant circuits has an electrode width that is different from electrode widths of the remaining inductor internal electrodes.

8. The multilayer filter according to claim 4, wherein at least one of the inductor internal electrodes of the plurality of resonant circuits is provided on a different dielectric layer of the plurality of dielectric layers from dielectric layers of the plurality of dielectric layers including the remaining inductor internal electrodes provided thereon.

9. A multilayer filter comprising:
a multilayer body defined by a laminate including a plurality of dielectric layers and including a plurality of mutually coupled resonant circuits within the multilayer body;
first and second mounting surface electrodes each defining a ground electrode or an input-output electrode and being provided on a mounting surface of the multilayer body, the mounting surface extending in a direction perpendicular or substantially perpendicular to a lamination direction of the plurality of dielectric layers; wherein
at least one of the plurality of resonant circuits includes:
first and second capacitor internal electrodes provided on different ones of the plurality of dielectric layers and arranged to oppose each other in the lamination direction of the plurality of dielectric layers;
an inductor internal electrode provided on only one of the plurality of dielectric layers that is different from the ones of the plurality of dielectric layers including the first and second capacitor internal electrodes provided thereon;
a first inductor via electrode directly physically and electrically connected to the inductor internal electrode and the first capacitor internal electrode;
a second inductor via electrode directly physically and electrically connected to the inductor internal electrode and the second capacitor internal electrode;
at least one of a first mounting surface connection via electrode directly physically and electrically connected to the first capacitor internal electrode and to one of the first mounting surface electrodes and a second mounting surface connection via electrode directly physically and electrically connected to the second capacitor internal electrode and to one of the second mounting surface electrodes;
the first capacitor internal electrode is located closer to the mounting surface than the second capacitor internal electrode and is arranged so that the first capacitor internal electrode does not overlap a respective one of the second mounting surface electrodes when viewed in the lamination direction of the plurality of dielectric layers; and
in each of the plurality of resonant circuits, the first capacitor internal electrode is provided on one of the plurality of dielectric layers that includes the mounting surface.

10. The multilayer filter according to claim 9, wherein the second capacitor internal electrode overlaps the first mounting surface electrode when viewed in the lamination direction of the plurality of dielectric layers.

11. A multilayer filter comprising:
a multilayer body defined by a laminate including a plurality of dielectric layers and including a plurality of mutually coupled resonant circuits within the multilayer body;
first and second mounting surface electrodes each defining a ground electrode or an input-output electrode and being provided on a mounting surface of the multilayer body, the mounting surface extending in a direction perpendicular or substantially perpendicular to a lamination direction of the plurality of dielectric layers; wherein
at least one of the plurality of resonant circuits includes:
first and second capacitor internal electrodes provided on different ones of the plurality of dielectric layers and arranged to oppose each other in the lamination direction of the plurality of dielectric layers;
an inductor internal electrode provided on only one of the plurality of dielectric layers that is different from the ones of the plurality of dielectric layers including the first and second capacitor internal electrodes provided thereon;
a first inductor via electrode directly physically and electrically connected to the inductor internal electrode and the first capacitor internal electrode;
a second inductor via electrode directly physically and electrically connected to the inductor internal electrode and the second capacitor internal electrode;
at least one of a first mounting surface connection via electrode directly physically and electrically connected to the first capacitor internal electrode and to one of the first mounting surface electrodes and a second mounting surface connection via electrode directly physically and electrically connected to the second capacitor internal electrode and to one of the second mounting surface electrodes;
the first capacitor internal electrode is located closer to the mounting surface than the second capacitor internal electrode and is arranged so that the first capacitor internal electrode does not overlap a respective one of the second mounting surface electrodes when viewed in the lamination direction of the plurality of dielectric layers; and
the plurality of resonant circuits includes:
a resonant circuit at an input stage;
a resonant circuit at an output stage;
a resonant circuit at an intermediate stage coupled with at least one of the resonant circuit at the input stage and the resonant circuit at the output stage;
each of the resonant circuit at the input stage and the resonant circuit at the output stage includes the first mounting surface connection via electrode and the second mounting surface connection via electrode;

the resonant circuit at the intermediate stage includes only one of the first mounting surface connection via electrode and the second mounting surface connection via electrode; and the one of the first mounting surface electrodes and the one of the second mounting surface electrodes connected to the only one of the first mounting surface connection via electrode and the second mounting surface connection via electrode of the resonant circuit at the intermediate stage is a ground electrode.

12. The multilayer filter according to claim 11, wherein the only one of the first and second mounting surface connection via electrodes is directly and electrically connected to the ground electrode.

13. The multilayer filter according to claim 11, wherein the ground electrode connected to the only one of the first mounting surface connection via electrode and the second mounting surface connection via electrode of the resonant circuit at the intermediate stage is arranged between the input-output electrodes on the mounting surface.

14. The multilayer filter according to claim 11, wherein each of the resonant circuit at the input stage, the resonant circuit at the output stage, and the resonant circuit at the intermediate stage includes a loop defined by the inductor internal electrode, the first inductor via electrode, and the second inductor via electrode; and a direction in which the loop of the resonant circuit at the intermediate stage winds is the same as a direction in which the loops of the resonant circuits at the input and output stages wind.

15. The multilayer filter according to claim 11, wherein each of the resonant circuit at the input stage, the resonant circuit at the output stage, and the resonant circuit at the intermediate stage includes a loop defined by the inductor internal electrode, the first inductor via electrode, and the second inductor via electrode; and a direction in which the loop of the resonant circuit at the intermediate stage winds is opposite to a direction in which the loops of the resonant circuits at the input and output stages wind.

16. A multilayer resonator comprising:

a multilayer body defined by a laminate including a plurality of dielectric layers;

first and second mounting surface electrodes defining a ground electrode or an input-output electrode and being provided on a mounting surface of the multilayer body, the mounting surface extending in a direction perpendicular or substantially perpendicular to a lamination direction of the plurality of dielectric layers;

first and second capacitor internal electrodes provided on different ones of the plurality of dielectric layers and arranged to oppose each other in the lamination direction of the plurality of dielectric layers;

an inductor internal electrode provided on one of the plurality of dielectric layers that is different from the ones of the plurality of dielectric layers including the first and second capacitor internal electrodes provided thereon;

a first inductor via electrode electrically connected to the inductor internal electrode and the first capacitor internal electrode;

a second inductor via electrode electrically connected to the inductor internal electrode and the second capacitor internal electrode;

a first mounting surface connection via electrode directly physically and electrically connected to the first capacitor internal electrode and to the first mounting surface electrode; and a second mounting surface connection via electrode directly physically and electrically connected to the second capacitor internal electrode and to the second mounting surface electrode; wherein the first capacitor internal electrode is located closer to the mounting surface than the second capacitor internal electrode and is arranged so that the first capacitor internal electrode does not overlap the second mounting surface electrode when viewed in the lamination direction of the plurality of dielectric layers; and no electrodes are disposed between the first capacitor internal electrode and the first mounting surface electrode in the lamination direction of the plurality of dielectric layers.

17. The multilayer resonator according to claim 16, wherein the second capacitor internal electrode overlaps the first mounting surface electrode when viewed in the lamination direction of the plurality of dielectric layers.

18. The multilayer resonator according to claim 16, wherein the first capacitor internal electrode is provided on one of the plurality of dielectric layers that includes the mounting surface.

19. A multilayer resonator comprising:

a multilayer body defined by a laminate including a plurality of dielectric layers;

a first mounting surface electrode defining a ground electrode and being provided on a mounting surface of the multilayer body, the mounting surface extending in a direction perpendicular or substantially perpendicular to a lamination direction of the plurality of dielectric layers;

a second mounting surface electrode defining an input-output electrode and being provided on the mounting surface of the multilayer body;

first and second capacitor internal electrodes provided on different ones of the plurality of dielectric layers and arranged to oppose each other in the lamination direction of the plurality of dielectric layers;

an inductor internal electrode provided on one of the plurality of dielectric layers that is different from the ones of the plurality of dielectric layers including the first and second capacitor internal electrodes provided thereon;

a first inductor via electrode electrically connected to the inductor internal electrode and the first capacitor internal electrode;

a second inductor via electrode electrically connected to the inductor internal electrode and the second capacitor internal electrode;

a first mounting surface connection via electrode directly physically and electrically connected to the first capacitor internal electrode and to the first mounting surface electrode; and a second mounting surface connection via electrode directly physically and electrically connected to the second capacitor internal electrode and to the second mounting surface electrode; wherein the first capacitor internal electrode is located closer to the mounting surface than the second capacitor internal electrode and is arranged so that the first capacitor internal electrode does not overlap the second mounting surface electrode when viewed in the lamination direction of the plurality of dielectric layers.

20. The multilayer resonator according to claim 19, wherein the second capacitor internal electrode overlaps the first mounting surface electrode when viewed in the lamination direction of the plurality of dielectric layers.

21. The multilayer resonator according to claim 19, wherein the first capacitor internal electrode is provided on one of the plurality of dielectric layers that includes the mounting surface.

* * * * *